(12) United States Patent
Fry

(10) Patent No.: US 6,362,699 B1
(45) Date of Patent: Mar. 26, 2002

(54) TEMPERATURE COMPENSATING CIRCUIT FOR A CRYSTAL OSCILLATOR

(75) Inventor: Steven Fry, Carlisle, PA (US)

(73) Assignee: Dynamics Corporation of America, Elkhart, IN (US)

( * ) Notice: Subject to any disclaimer, the term of this patent is extended or adjusted under 35 U.S.C. 154(b) by 0 days.

(21) Appl. No.: 09/335,245

(22) Filed: Jun. 17, 1999

Related U.S. Application Data

(63) Continuation-in-part of application No. 08/961,689, filed on Oct. 31, 1997.

(51) Int. Cl.[7] .............................................. H03B 5/32
(52) U.S. Cl. ..................... 331/176; 331/116 R; 331/66; 331/158
(58) Field of Search ........................... 331/66, 176, 158, 331/116 R, 44

(56) References Cited

U.S. PATENT DOCUMENTS

| | | | | |
|---|---|---|---|---|
| 4,020,426 A | * | 4/1977 | Helle | ......................... 331/158 |
| 5,041,799 A | * | 8/1991 | Pirez | ........................... 331/44 |
| 5,781,075 A | * | 7/1998 | Bolton, Jr. et al. | ......... 331/176 |

OTHER PUBLICATIONS

D.E. Newell and R.H. Bangert, "Temperature Compensation of Quartz Crystal Oscillators", Proceedings of the 17th Frequency Control Symposium, 1963, pp. 491–507.

D.E. Newell and H. Hinnah, "Automatic Compensation Equipment for TCXO's", Proceeding of the 22nd Frequency Control Symposium, 1968, pp. 298–310.

M. Frerking, "Crystal Oscillator Design and Temperature Compensation", Van Nostrand Reinhold Co., 1978, pp. 130–176.

\* cited by examiner

*Primary Examiner*—Arnold Kinkead

(57) ABSTRACT

An electrical device to compensate for crystal oscillator frequency shifts occurring over a temperature range includes a voltage divider for generating a temperature variable, compensation voltage at an output. The output of the voltage divider is to be electrically coupled to the oscillator so that the compensation voltage compensates for the crystal oscillator frequency shifts otherwise occurring over the temperature range. A voltage source is to be coupled to an input of the voltage divider for inputting a generally fixed voltage during normal crystal oscillator operation, and providing for multiple and repeatable adjustments to the fixed voltage before beginning the normal crystal oscillator operation.

16 Claims, 4 Drawing Sheets

TEMPERATURE COMPENSATING CIRCUIT FOR A CRYSTAL OSCILLATOR

This application is a C-I-P of Ser. No. 08/961,689 filed Oct. 31, 1997.

FIELD OF THE INVENTION

The present invention relates generally to crystal oscillators and more specifically to a temperature compensated crystal oscillator having a compensating circuit that stabilizes the output frequency of the crystal oscillator over a desired temperature range.

BACKGROUND OF THE INVENTION

Crystal oscillators are commonly used for a number of applications that require a stable output frequency. The output frequency, however, varies as a function of the ambient temperature of the oscillator. FIG. 1 shows a graphical representation of the frequency of a typical uncompensated AT cut quartz crystal versus the ambient temperature. As shown the curve 6 has a generally cubic curve shape that can be characterized by three temperature regions. The curve in the cold temperature region (−35° C. to approximately +10° C.) has a linear portion having a positive slope and a nonlinear portion wherein the slope of the curve changes polarity. The curve in the middle temperature region (+10° C. to +50° C.) has a linear portion having a negative slope. The curve in the hot temperature region (+50° C. to +90° C.) has a linear portion having a positive slope and a nonlinear portion wherein the slope of the curve changes polarity. The point of inflection 8 is in the middle temperature region at approximately +28° C.

A number of techniques to compensate for this frequency variation of the crystal includes the use of analog circuitry. One such analog compensation technique uses a resistor/thermistor network. For temperature range applications that extend into the non-linear portions of the AT cut crystal curve, at least three thermistors are necessary to compensate for each temperature region. Negative temperature coefficient thermistors are put into a network with a number of fixed resistors. The network is then supplied with a stable, fixed voltage source. By selecting the proper thermistors (for nominal value and temperature slope) and the value of the fixed resistors in the network, it is possible to match a variety of "AT" cut crystals and cancel the frequency vs. temperature drift over a wide temperature range. Stabilities of better than 0.5 ppm can be achieved with this method over a temperature range of −40° C. to +85° C.

While this technique is well suited to some applications, there are some disadvantages which limit wider usage. First, a wide range of precision, tight tolerance resistors (usually 1% or better) must be stocked. Second, a set of resistor values unique to each oscillator must be selected and manually installed. Third, the calculations and measurements necessary to select these components result in a time consuming process of iteratively testing, changing components, and re-testing the oscillators until they have been "massaged" to meet the specifications. Fourth, the thermistors must also be selected so that the thermistor slopes and ratios match the crystal being used. Fifth, interactions between the thermistors in the combined network limit the precision of the compensation that can be achieved. Sixth, because of the simple voltage divider action of the network, the output voltage has a limited dynamic range making operation at low voltages impractical.

Some attempts at automating the "massaging" process by trimming the resistors and matching the crystal have been successful for specific applications with moderate stabilities, however full automation has proven to be very difficult. Further, it is impossible to reverse the trimming process in order to decrease the resistance of the trimmed resistor. Resistors which are trimmed are typically screen printed onto the circuit substrate, and therefore cannot be simply replaced.

One method for tuning a crystal oscillator is shown in U.S. Pat. No. 5,473,289. A single linear temperature sensor is used as implemented by one or more diodes. This combination produces a straight line function of voltage vs. temperature which is then applied to a plurality of voltage function generator circuits that generate a series of straight line segments of varying slopes and intercepts. A switching circuit then controls which segment is active at a given temperature, in effect summing all of the segments over the operating temperature range to give an approximation of the crystal curve made up of a series of straight lines. A drawback with this approach is that the compensation voltage does not generate a smooth match to the cubic crystal curve, but rather employs discrete, distinct segments with crossover points to approximate the cubic crystal curve.

Another analog method uses thermistor/capacitor networks in a similar manner as the resistor/thermistor networks by adjusting the effective reactance of one or more fixed capacitors as the temperature varies. This method is very cost effective and has been produced for consumer applications requiring moderate stabilities of +/−2.5 ppm over a tighter temperature range. For applications that require operation in a wider temperature range, tighter matching of the components is required which becomes increasingly difficult due to the inability to match the crystal slopes and limitations in component values, tolerances and stabilities.

Another analog method uses multipliers that multiply a voltage which is linearly proportional to temperature which then generates a square and cubic term. These signals are then scaled appropriately and added together to produce a third order polynomial which matches the crystal curve to be compensated. This process still requires a set of resistors to be selected or trimmed and therefore, requires subsequent corrections which requires physical replacement or modification of one or more resistors.

A digital compensation technique includes the use of look-up tables. The frequency differential crystal curve between a selected temperature range is stored in a look-up table. The binary data stored at each memory location of the look-up table contains a compensation value that corresponds to each temperature increment. The output of a linear temperature sensor is digitized over the operating temperature range by an analog-to-digital (A/D) converter. The output from the A/D converter addresses the look-up table stored in nonvolatile ROM. The selected binary compensation value that corresponds to the ambient temperature of the oscillator is converted to a voltage by a digital-to-analog (D/A) converter which is used to tune the frequency of the crystal oscillator.

The ultimate stability obtainable by this approach is determined by the resolution of the A/D and D/A converters. Stabilities better than the hysteresis and repeatability of an AT cut crystal (about 0.05 ppm) are achievable over some temperature ranges with the proper system design.

All digital compensation systems, however, exhibit some degree of quantization noise, caused by the discrete steps of the conversion process. This is seen as a discrete jump in the output frequency as the compensation is updated. This effect can be minimized by increasing the resolution of the converters and filtering of the output, but it is very difficult to reduce it below the tolerance threshold of some systems. Spurious noise caused by feedthrough and coupling of digital switching components can also be a severe problem.

Another digital compensation technique used a microcomputer. This greatly reduced the amount of non-volatile programmable memory that is needed since interpolation or curve-fitting routines required much less stored data. Some success at Application Specific Integrated Circuit (ASIC) implementation has been achieved, but various issues have prevented these oscillators from being widely used.

The latest approaches for microcomputer compensation have used crystal self-temperature sensing techniques for best accuracy and repeatability. This method operates the crystal on both the fundamental and third overtone modes simultaneously. This is usually done with an SC cut crystal, but it is also possible with AT cut crystals. The apparent angle shift between the modes produces a signal which is very accurately proportional to temperature when the difference between the third overtone frequency and the fundamental multiplied by three (3) is compared. Since the frequency of these oscillators cannot be adjusted or tuned without affecting the calibration of the thermometer signal, external means for generating the stable output frequency must be employed.

This type of microcomputer controlled TCXO utilizing crystal self-temperature sensing has achieved the best stability of any compensated oscillator. Overall stabilities of better than 0.05 ppm over −55° C. to +85° C. have been reported. The complexities of these oscillators, however, make them relatively expensive, and they still suffer from some of the noise problems which are inherent in digital compensation systems.

Accordingly, it is an object of the present invention to provide a cost effective crystal oscillator that has a highly stable output frequency over a desired temperature range.

It is another object to provide a crystal oscillator wherein the tuning of the output frequency may be easily adjusted.

It is a further object to provide temperature compensated crystal oscillator that eliminates the need to trim or select the proper component value.

The above and other objects and advantages of this invention will become more readily apparent when the following description is read in conjunction with the accompanying drawings.

SUMMARY OF THE INVENTION

In one aspect of the present invention, an electrical device to compensate for crystal oscillator frequency shifts occurring over a temperature range includes a voltage divider for generating a temperature variable, compensation voltage at an output. The output of the voltage divider is to be electrically coupled to the oscillator so that the compensation voltage compensates for the crystal oscillator frequency shifts otherwise occurring over the temperature range. A voltage source is to be coupled to an input of the voltage divider for inputting a generally fixed voltage during normal crystal oscillator operation, and providing for multiple and repeatable adjustments to the fixed voltage before beginning the normal crystal oscillator operation.

In another aspect of the present invention, a method for tuning a crystal oscillator that has a temperature compensating circuit and a voltage source for inputting a tuning voltage to the temperature compensating circuit includes the steps of a) providing a tuning voltage from the voltage source to the temperature compensating circuit; b) determining a frequency variation range of the crystal oscillator over a temperature range; c) comparing the frequency variation range to a desired frequency operating range; d) setting the voltage source to permanently generate the voltage if the frequency variation range is equal to or less than the desired frequency operating range; and e) adjusting the voltage source to generate a different tuning voltage if the variation range is greater than the desired frequency operating range and repeating steps a–e with the different tuning voltage.

In a further aspect of the present invention, a temperature compensated crystal oscillator includes a voltage tunable crystal oscillator having a crystal with a resonant frequency that varies over a temperature range. A voltage divider generates a temperature variable, compensation voltage at an output. The output of the voltage divider is to be electrically coupled to the oscillator so that the compensation voltage compensates for the crystal oscillator frequency shifts otherwise occurring over the temperature range. A voltage source is to be coupled to an input of the voltage divider for inputting a generally fixed voltage during normal crystal oscillator operation, and providing for multiple and repeatable adjustments to the fixed voltage before beginning the normal crystal oscillator operation.

DETAILED DESCRIPTION OF THE PREFERRED EMBODIMENT

Figure 1:
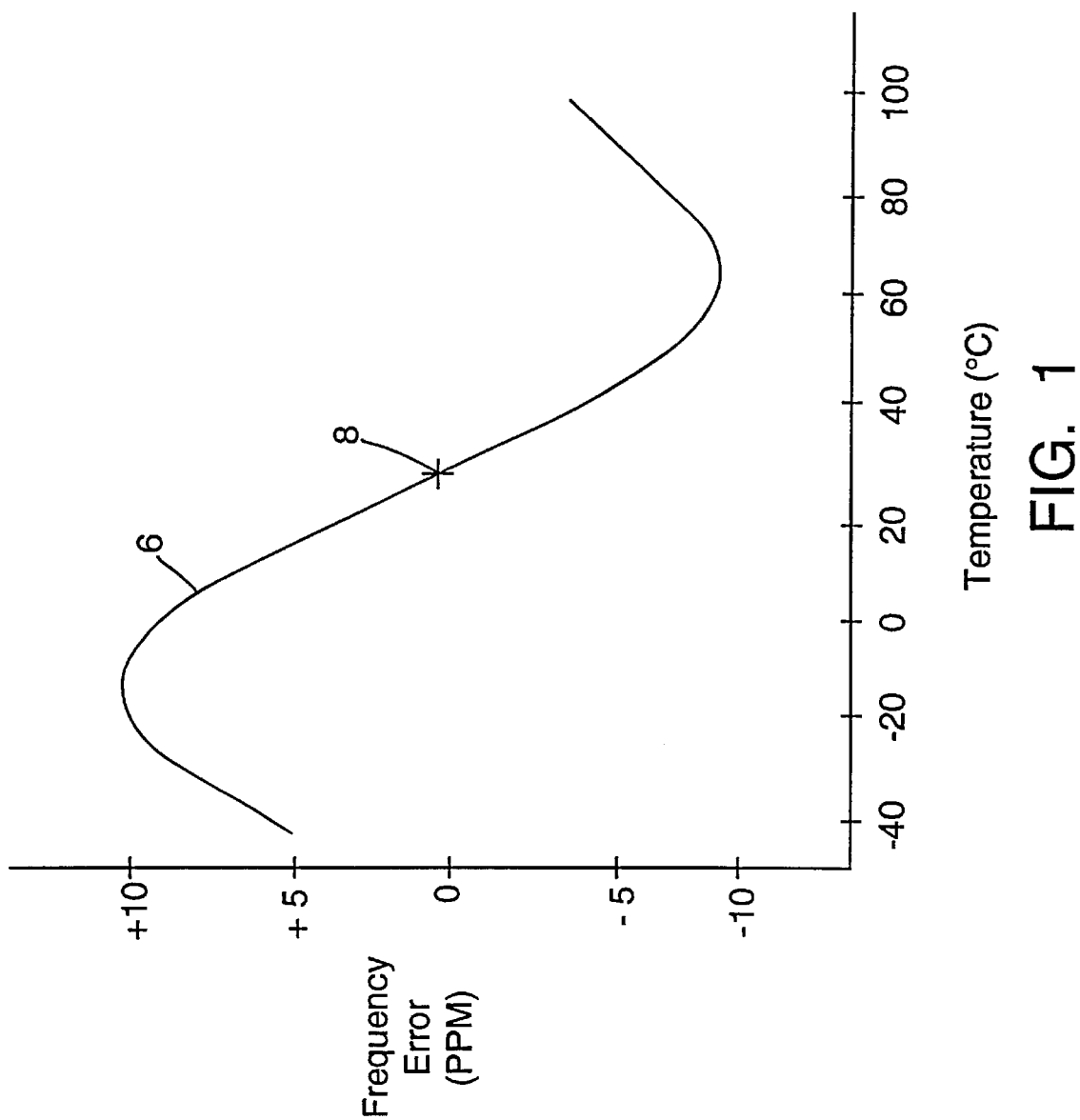
FIG. 1 is a graphical representation of the cubic shape curve of the frequency of an uncompensated AT crystal as it varies over temperature.
Figure 2:
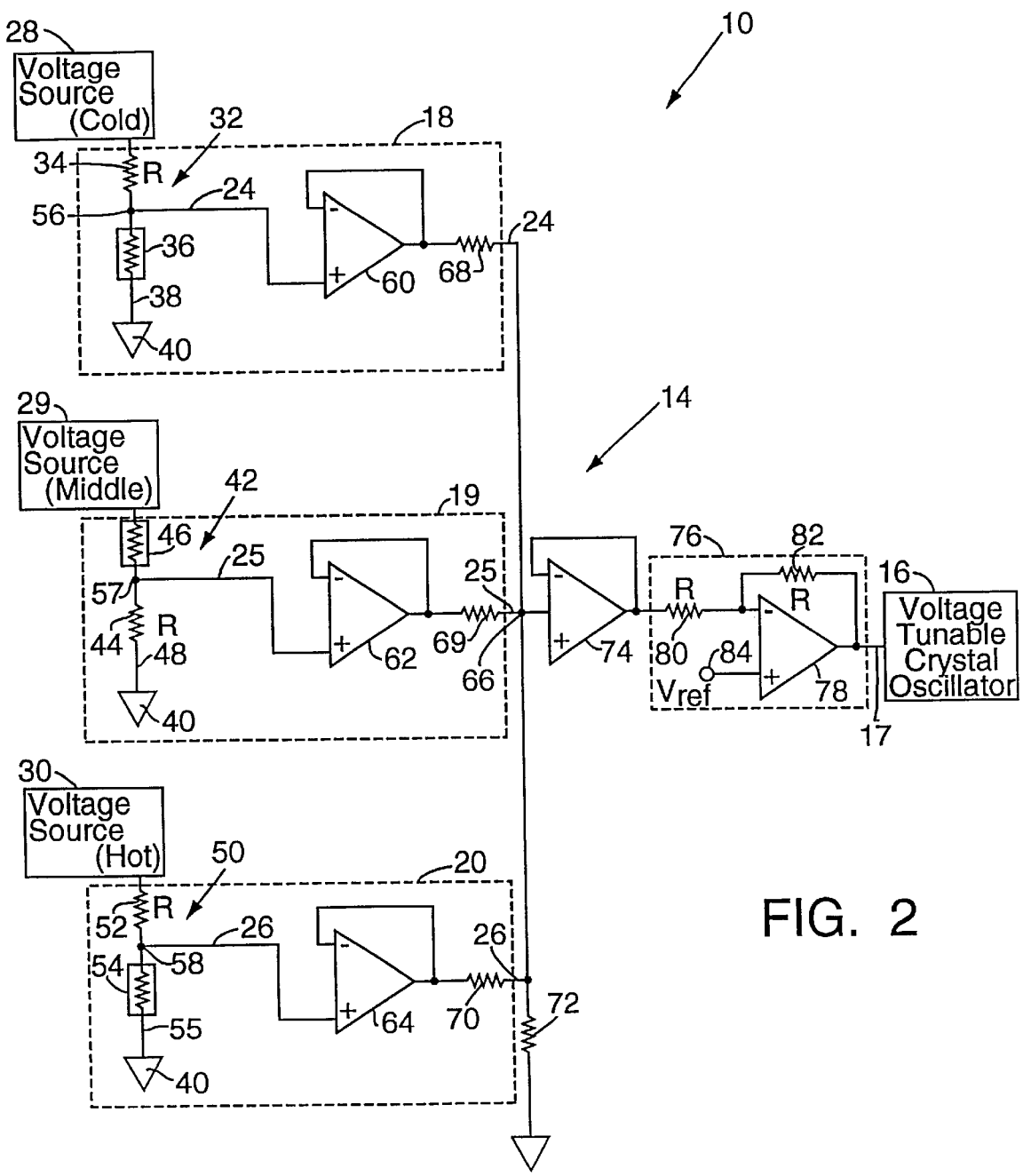
FIG. 2 is a circuit diagram of temperature compensated crystal oscillator including a temperature compensating circuit embodying the preferred embodiment of this invention.

FIG. 2 illustrates a temperature compensated crystal oscillator (TCXO) 10 embodying the present invention that includes a compensating circuit 14 and a voltage tunable crystal oscillator (VCXO) 16. The compensating circuit generates a voltage control signal at 17 to the voltage tunable crystal oscillator to compensate for the variations in frequency of the crystal over an operating temperature range as shown in FIG. 1. The voltage tunable oscillator 16 is known in the art and therefore, not discussed in great detail.

The compensating circuit 14 includes three networks 18, 19, 20 to compensate for the frequency variation of the crystal 22 over hot, cold and middle temperature regions. The cold temperature network 18 primarily compensates for the frequency variation within the cold temperature region (approximately −35° C. to +10° C.). The middle temperature network 19 primarily compensates for the frequency variation within the medium temperature region (approximately +10° C. to +50° C.). The hot temperature network 20 primarily compensates for the frequency variation within the hot temperature region (approximately +50° C. to +90° C.). The change in output voltages at 24–26 of each of the networks 18–20 are inversely proportional to the change in frequency of the crystal associated with a change in temperature within a corresponding temperature region of the crystal curve. For example, the output voltages at 24, 26 have a negative slope that is inversely proportional to the slope of the frequency change of the crystal in the hot and cold temperature regions, respectively, of the crystal curve of FIG. 1. The output voltage at 25 has a positive slope which is inversely proportional to the slope of the frequency change of the crystal in the middle temperature region of the crystal curve. The combination of these three signals 24–26 in the proper proportions will therefore cancel and compensate for the characteristic drift in frequency of the crystal over the temperature range that includes the cold, middle and hot temperature regions.

Three independently adjustable analog voltage sources 28, 29, 30 are provided to the corresponding cold temperature compensating network 18, middle temperature compensating network 19 and a hot temperature compensating network 20. Contrary to the prior art, each of the voltage sources 28–30 are set independently of one another to tune the output voltages at 24–26 respectively so that the summed control signal compensates for the frequency change of the oscillator generated by the crystal over the entire temperature range. This ability to independently adjust the voltages of the output sources 28–30 enables the compensating networks 18–20 to be easily tuned by multiple and repeatable adjustments to the voltages of the output sources to match the individual crystal so as to eliminate the need for accurately adjusting the compensating networks using resistors having tight tolerances. This method of tuning the networks 18–20 also eliminates the need to trim the resistors or iteratively change resistors to obtain the desired compensating voltage and matching the crystal as described hereinbefore. Once the voltages from the output sources 28–30 are set, the voltages are held constant throughout the operating life of the oscillator.

The cold temperature voltage source 28 is connected to a first voltage divider 32 comprising resistor 34 and thermistor 36. The thermistor 36 is connected to the lower leg of the voltage divider 32 having one terminal 38 connected to ground 40. The thermistor 36 has a negative temperature coefficient and thus, its resistance decreases as the ambient temperature increases. Consequently, the voltage at junction 56 decreases as the temperature increases. The middle temperature voltage source 29 is connected to a second voltage divider 42 comprising resistor 44 and thermistor 46, which has a negative temperature coefficient. The thermistor 46 is connected to the upper leg and the resistor 44 is connected to the lower leg of the voltage divider 42 having one terminal 48 connected to ground 40. Consequently the voltage at junction 57 increases as the ambient temperature increases. The hot temperature voltage source 30 is connected to a third voltage divider 50 comprising resistor 52 and thermistor 54, which also has a negative temperature coefficient. The thermistor 54 is connected to the lower leg of the voltage divider 50 having one terminal 55 connected to ground 40. Consequently, the voltage at junction 58 decreases as the ambient temperature increases.

The junctions 56–58 of each of the voltage dividers 32, 42, 50 are connected to a respective voltage follower 60, 62, 64 which buffer the attenuated signals to eliminate any interaction between each of the compensating networks 18–20. The output of each voltage followers 60, 62, 64 is summed at junction 66 through respective resistors 68–70. Resistor 72 is connected between junction 66 and ground 40. The summed voltage is provided to a voltage follower 74 to provide additional buffering from the oscillator 16. The output voltage of voltage follower 74 is amplified and offset by amplifier stage 76. The output of voltage follower 74 is provided to the inverting input of amplifier 78 through resistor 80. Resistor 82 is connected between the output and inverting input of amplifier 78. An offset voltage 84 is connected to the non-inverting input of amplifier 78.

The resulting composite voltage control signal at 17 of the compensating circuit 14 is inversely proportional to the crystal curve of the FIG. 1 which adjusts the frequency of the voltage tunable oscillator 16 to compensate for the frequency variation of the crystal over a desired temperature range. The voltage dividers 32, 42, 50 generate a logarithmic voltage vs. temperature function in response to the temperature range affecting the crystal oscillator to compensate for frequency shifts otherwise occurring over the temperature range. The composite control signal is consequently a smooth blend of the various logarithmic thermistor characteristics which produces an accurate match to the cubic crystal curves.

Figure 3:
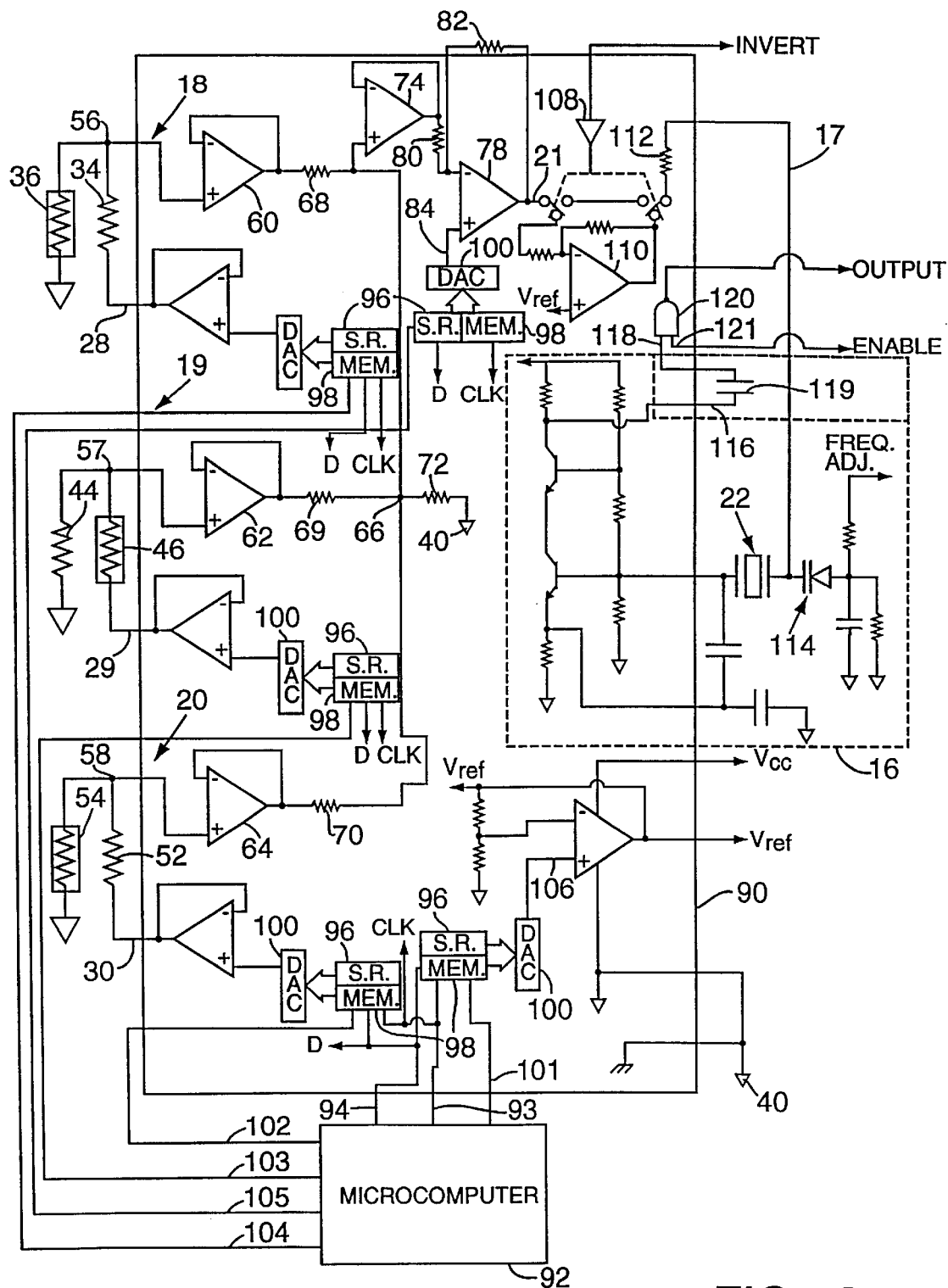
FIG. 3 is a circuit diagram showing an alternative embodiment of a temperature compensated crystal oscillator of the present invention.

Turning to FIG. 3, an embodiment of the present invention is implemented using an application specific integrated circuit (ASIC) 90. The reference numbers for the components common with the embodiment of FIG. 2 are the same. As shown, the voltage sources 28–30 for each of the compensating networks 18–20 are repeatedly adjustable by programmable controller or microcomputer 92 which is used only during calibration. Once the oscillator is tuned, the compensation voltages generated by the voltage sources 28–30 are generally held at fixed values throughout the operating life of the oscillator. Microcomputer 92 provides, using a serial link, a clock signal at port 93 and a data signal at port 94 to each respective shift register 96 and memory means 98 disposed on the ASIC 90 which independently generate a digital signal representative of a desired voltage for tuning the respective compensating network 18–20 as described hereinbefore. Each digital signal is then converted to an analog signal by digital-to-analog converters (DACs) 100 which respectively provide the cold, middle and hot temperature voltages of the voltage sources 28–30 (see FIG. 2). Each shift register 96 and memory means 98 are enabled by a digital signal at ports 101, 102, 103, 104, 105, so that the proper data may be loaded into the respective shift registers during calibration.

Similarly, the offset voltage 84 provided to amplifier 78 and reference voltage 106 is generated by microcomputer 92 in the same manner as the compensating voltages 28–30.

The voltage control signal at 21 of the compensating circuit 14 is provided to a switching means 108 that can switch inverting amplifier 110 in series with the compensating circuit 14 to switch the polarity of the output voltage of the compensating circuit 14. The output voltage signal is then provided to a voltage controlled oscillator circuit 16 through resistor 112. The voltage control oscillator circuit, which includes a crystal 22 and varactor 114 to control the resonant frequency of the oscillator, is known in the art. The output signal of the oscillator 16 at 116 is connected to capacitor 119 to remove the DC component of the output signal. The output of the oscillator 16 may be connected to one input 118 of a nand gate 120, and the other input 121 is provided to disable the output of the oscillator 16 by pulling the input 121 low.

Figure 4:
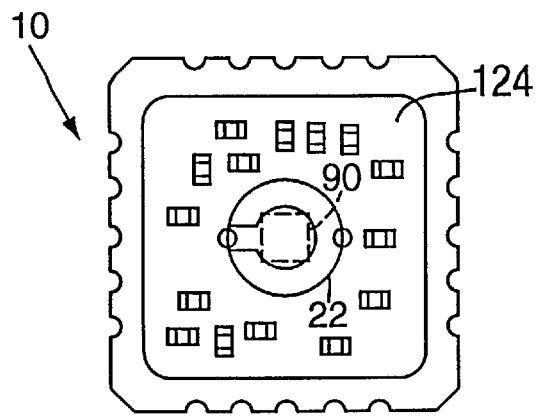
FIG. 4 is a top plan view of a temperature compensated crystal oscillator of FIG. 3.
Figure 5:
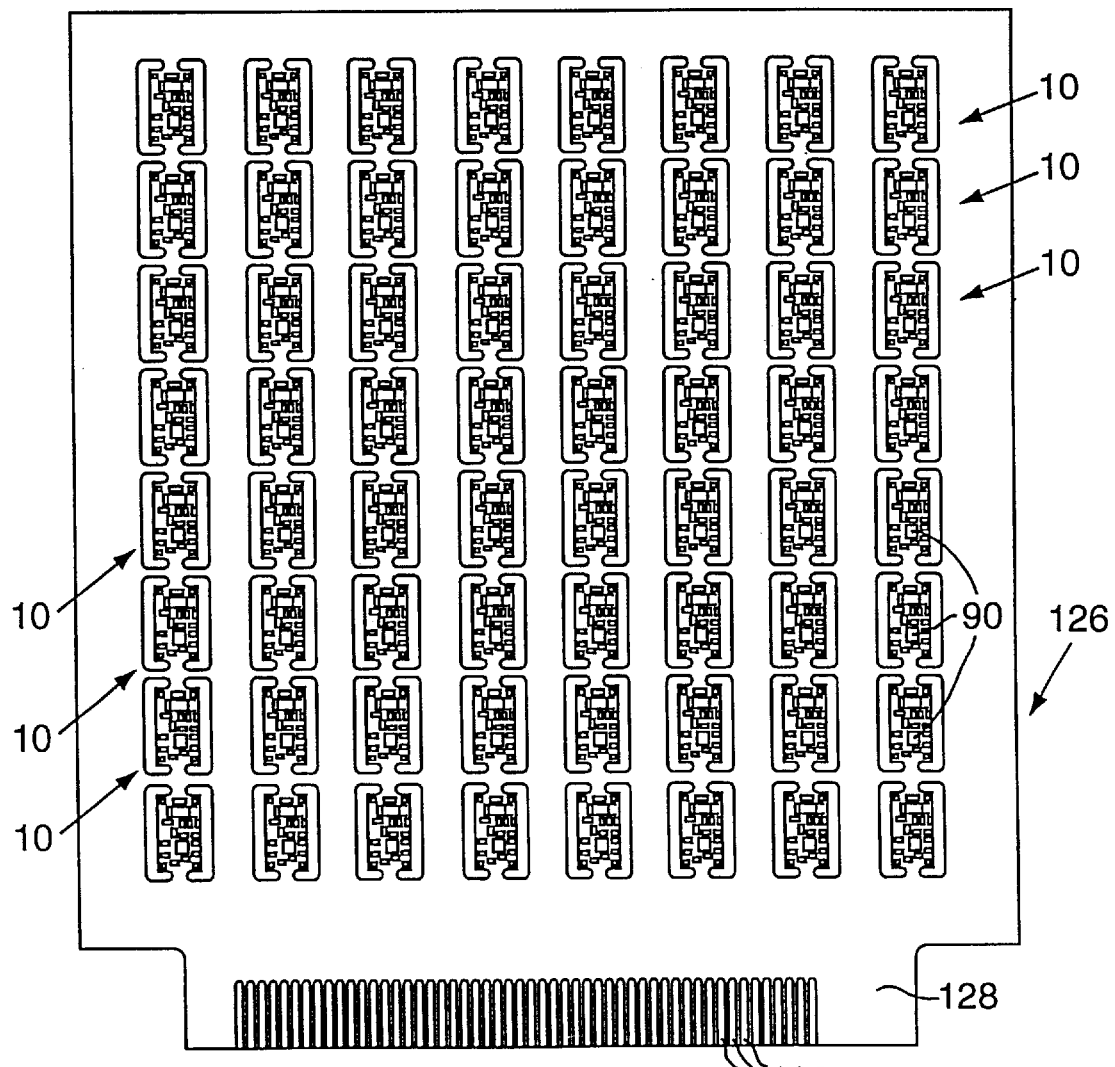
FIG. 5 is a top plan view of a common board including a plurality of temperature compensated crystal oscillators of FIG. 3.

The ASIC 90 includes the components that are generic to all oscillators 10 of the type embodying this invention, and the components that vary in accordance with the crystal frequency and type, such as the voltage dividers 32, 42, 50 and the crystal 22, are disposed on a circuit board 124 adjacent the ASIC 90 as shown in FIG. 4. This configuration allows a single ASIC to be used for all oscillators irrespective of its frequency. In addition, the use of the ASIC 90 permits the oscillators 10 to be produced at reduced costs. As shown in FIG. 5, a plurality of oscillators having an ASIC that may be assembled and tested on a common board 126 before separation therefrom. The common board 126 includes a connector 128 having terminals 130 interconnected to each ASIC. The common board is interconnected to a test bed (not shown) which tests each ASIC.

A typical calibration procedure includes providing tuning voltages from the voltage sources 28–30. The frequency variation range of the crystal oscillator over a temperature range is then determined. The frequency variation range is then compared to a desired frequency operating range. The voltage sources are permanently set to generate the source voltages if the frequency variation range is equal to or less than the desired frequency operating range. If, however, the variation range is greater than the desired frequency operating range, the voltage sources are adjusted to generate a different tuning voltage and the calibration steps are repeated.

In sum, the invention shown in the above-described embodiment permits all of the oscillators to be assembled with identical components. By employing conventional digital to analog (DAC) converters for the variable voltage sources, the compensation process can be completely automated. The DACs provide much better resolution in making adjustments (approximately 0.03% tolerance vs. the conventional 1% tolerance for resistor selection). By eliminating the interactions between the sections of the network, matching to the crystal within a few tenths of a ppm may be achieved.

Although the invention has been shown and described with respect to an exemplary embodiment thereof, it should be understood by those skilled in the art that the foregoing and various other changes, omissions, and additions in the form and detail thereof may be made therein without departing from the spirit and scope of the invention.

What is claimed is:

1. An electrical device to compensate for crystal oscillator frequency shifts in a voltage tunable crystal oscillator occurring over a temperature range, comprising:
    a) first, second and third voltage dividers responsive to temperature change for generating temperature variable, compensation voltages;
    b) first, second and third voltage sources to be respectively coupled to inputs of the first, second and third voltage dividers for inputting generally fixed voltages during normal crystal oscillator operation, and providing for multiple and repeatable adjustments to the fixed voltages before beginning the normal crystal oscillator operation, the first through third voltage dividers each including a resistor and negative temperature coefficient thermistor connected in series from the associated voltage source to ground potential to compensate for frequency shift over a respective cold, middle and hot temperature region, each of the thermistors of the first and third voltage dividers being interposed between the associated resistor and ground potential and the thermistor of the second voltage divider being interposed between the associated voltage source and the associated resistor; and
    c) a summing means for combining compensation signals generated by the voltage dividers to generate a summed control signal for tuning the crystal oscillator such that the output frequency of the crystal oscillator is substantially stable over the cold, middle and hot temperature regions.

2. An electrical device as defined in claim 1, wherein the voltage sources include a programmable controller for providing the multiple and repeatable adjustments to the fixed voltages.

3. An electrical device as defined in claim 1, wherein the voltage sources include means for providing multiple and repeatable adjustments to the fixed voltages without physically replacing or trimming discrete components otherwise associated with the tuning of a temperature compensated crystal oscillator.

4. An electrical device as defined in claim 1, wherein the voltage dividers produce logarithmic voltage versus temperature functions in response to the temperature range affecting the crystal oscillator to compensate for frequency shifts otherwise occurring over the temperature range.

5. An electrical device as defined in claim 1, wherein the voltage dividers compensate for frequency shifts otherwise occurring in accordance with a cubic curve characteristic of the crystal oscillator.

6. A temperature compensated crystal oscillator comprising:
    a) a voltage tunable crystal oscillator including a crystal having a resonant frequency that varies over a temperature range;
    b) first, second and third voltage dividers responsive to temperature change for generating temperature variable, compensation voltages;
    c) first, second and third voltage sources to be respectively coupled to inputs of the first, second and third voltage dividers for inputting generally fixed voltages during normal crystal operation, and providing for multiple and repeatable adjustments to the fixed voltages before beginning the normal crystal operation, the first through third voltage dividers each including a resistor and negative temperature coefficient thermistor connected in series from the associated voltage source to ground potential to compensate for frequency shift over a respective cold, middle and hot temperature region, each of the thermistors of the first and third voltage dividers being interposed between the associated resistor and ground potential, and the thermistor of the second voltage divider being interposed between the associated voltage source and the associated resistor; and
    d) a summing means for combining compensation voltages generated by the voltage dividers to generate a summed control signal for tuning the crystal oscillator such that the output frequency of the crystal oscillator is substantially stable over the cold, middle and hot temperature regions.

7. A temperature compensated crystal oscillator as defined in claim 6, wherein the voltage sources include a programmable controller for providing the multiple and repeatable adjustments to the fixed voltages.

8. A temperature compensated crystal oscillator as defined in claim 6, wherein the voltage sources include means for providing multiple and repeatable adjustments to the fixed voltages without physically replacing or trimming discrete components otherwise associated with the tuning of a temperature compensated crystal oscillator.

9. A temperature compensated crystal oscillator as defined in claim 6, wherein the voltage dividers produce logarithmic voltage versus temperature functions in response to the temperature range affecting the crystal oscillator to compensate for frequency shifts otherwise occurring over the temperature range.

10. A temperature compensated crystal oscillator as defined in claim 6, wherein the voltage dividers compensate for frequency shifts otherwise occurring in accordance with a cubic curve characteristic of the crystal oscillator.

11. An electrical device to compensate for crystal oscillator frequency shifts in a voltage tunable crystal oscillator occurring over a temperature range, comprising:
   a) at least two voltage dividers each including a series connected thermistor and resistor to compensate for frequency shift over an associated temperature region that is generally distinct from a temperature region compensated for by other voltage dividers, the voltage dividers each for generating a temperature variable, compensation voltage at an output, the output of the voltage dividers to be electrically coupled to the crystal oscillator so that the compensation voltages compensate for the crystal oscillator frequency shifts otherwise occurring over the temperature range;
   b) at least two voltage sources independently adjustable from one another and each to be coupled to an input of a respective voltage divider for inputting a generally fixed voltage during normal crystal oscillator operation, and providing for multiple and repeatable adjustments to the fixed voltage before beginning the normal crystal oscillator operation; and
   c) a summing means for combining compensation voltages generated by the voltage dividers to generate a summed control signal for tuning the crystal oscillator such that the output frequency of the crystal oscillator is substantially stable over the corresponding temperature regions.

12. An electrical device to compensate for crystal oscillator frequency shifts in a voltage tunable crystal oscillator occurring over a temperature range, comprising:
   a) first, second and third voltage dividers each including a series connected thermistor and resistor to compensate for frequency shift over a respective cold, middle and hot temperature region that is generally distinct from a temperature region compensated for by the other voltage dividers, the voltage dividers each for generating a temperature variable, compensation voltage at an output, the output of the voltage dividers to be electrically coupled to the crystal oscillator so that the compensation voltages compensate for the crystal oscillator frequency shifts otherwise occurring over the temperature range;
   b) first, second and third voltage sources independently adjustable from one another and each to be coupled to an input of a respective one of the first, second and third voltage dividers for inputting a generally fixed voltage during normal crystal oscillator operation, and providing for multiple and repeatable adjustments to the fixed voltage before beginning the normal crystal oscillator operation; and
   c) a summing means for combining compensation voltages generated by the voltage dividers to generate a summed control signal for tuning the crystal oscillator such that the output frequency of the crystal oscillator is substantially stable over the cold, middle and hot temperature regions.

13. An electrical device as defined in claim 12, wherein the first through third voltage dividers each include a resistor and negative temperature coefficient thermistor connected in series from the associated voltage source to ground potential, each of the thermistors of the first and third voltage dividers being interposed between the associated resistor and ground potential, and the thermistor of the second voltage divider being interposed between the associated voltage source and the associated resistor.

14. A temperature compensated crystal oscillator comprising:
   a) a voltage tunable crystal oscillator including a crystal having a resonant frequency that varies over a temperature range;
   b) at least two voltage dividers each including a series connected thermistor and resistor to compensate for frequency shift over an associated temperature region that is generally distinct from a temperature region compensated for by other voltage dividers, the voltage dividers each for generating a temperature variable, compensation voltage at an output, the output of the voltage dividers to be electrically coupled to the crystal oscillator so that the compensation voltages compensate for the crystal oscillator frequency shifts otherwise occurring over the temperature range;
   c) at least two voltage sources independently adjustable from one another and each to be coupled to an input of a respective voltage divider for inputting a generally fixed voltage during normal crystal oscillator operation, and providing for multiple and repeatable adjustments to the fixed voltage before beginning the normal crystal oscillator operation; and
   d) a summing means for combining compensation voltages generated by the voltage dividers to generate a summed control signal for tuning the crystal oscillator such that the output frequency of the oscillator is substantially stable over the corresponding temperature regions.

15. A temperature compensated crystal oscillator comprising:
   a) a voltage tunable crystal oscillator including a crystal having a resonant frequency that varies over a temperature range;
   b) first, second and third voltage dividers each including a series connected thermistor and resistor to compensate for frequency shift over a respective cold, middle and hot temperature region, the voltage dividers each for generating a temperature variable, compensation voltage at an output, the output of the voltage dividers to be electrically coupled to the crystal oscillator so that the compensation voltages compensate for the crystal oscillator frequency shifts otherwise occurring over the temperature range; and
   c) first, second and third voltage sources independently adjustable from one another and each to be coupled to an input of a respective one of the first, second and third voltage dividers for inputting a generally fixed voltage during normal crystal oscillator operation, and providing for multiple and repeatable adjustments to the fixed voltage before beginning the normal crystal oscillator operation; and
   a summing means for combining compensation voltages generated by the voltage dividers to generate a summed control signal for tuning the crystal oscillator such that the output frequency of the crystal oscillator is substantially stable over the cold, middle and hot temperature regions.

16. A temperature compensated crystal oscillator as defined in claim 15, wherein the first through third voltage dividers each include a resistor and negative temperature coefficient thermistor connected in series from the associated voltage source to ground potential, each of the thermistors of the first and third voltage dividers being interposed between the associated resistor and ground potential, and the thermistor of the second voltage divider being interposed between the associated voltage source and the associated resistor.

* * * * *